(12) United States Patent
Ivantzov et al.

(10) Patent No.: US 6,562,124 B1
(45) Date of Patent: May 13, 2003

(54) METHOD OF MANUFACTURING GAN INGOTS

(75) Inventors: Vladimir Ivantzov, Gaithersburg, MD (US); Vitaliy Sukhoveev, Gaithersburg, MD (US); Vladimir Dmitriev, Gaithersburg, MD (US)

(73) Assignee: Technologies and Devices International, Inc., Gaithersburg, MD (US)

( * ) Notice: Subject to any disclaimer, the term of this patent is extended or adjusted under 35 U.S.C. 154(b) by 0 days.

(21) Appl. No.: 09/585,332

(22) Filed: Jun. 2, 2000

Related U.S. Application Data

(60) Provisional application No. 60/137,515, filed on Jun. 2, 1999.

(51) Int. Cl.[7] .............................. C30B 15/02; C30B 25/02
(52) U.S. Cl. .............................. 117/29; 117/13; 117/62; 117/103; 117/108; 117/952
(58) Field of Search .................. 117/29, 108, 13, 117/62, 103, 952

(56) References Cited

U.S. PATENT DOCUMENTS

| | | | | |
|---|---|---|---|---|
| 4,586,979 A | * | 5/1986 | Katsumata et al. | 117/29 |
| 4,620,897 A | * | 11/1986 | Nakajima | 117/29 |
| 5,858,086 A | | 1/1999 | Hunter | 117/84 |

* cited by examiner

*Primary Examiner*—Robert Kunemund
(74) *Attorney, Agent, or Firm*—McDermott, Will & Emery

(57) ABSTRACT

A novel method for growing semiconductor material including GaN is disclosed. The method involves placing a first substance into a growth reactor, supplying a second gaseous substance into the grouth reactor, and applying electrical field to the second gaseous substance to produce the crystalline compound material.

14 Claims, 7 Drawing Sheets

METHOD OF MANUFACTURING GAN INGOTS

This application claims priority of U.S. provisional patent application No. 60/137,515 filed on Jun. 2, 1999.

FELD OF THE INVENTION

The present invention relates to the growth of bulk semiconductor materials in a manner which provides a possibility to manufacture bulk crystals in the form of ingots, fabricate substrates from these ingots and thus enhancing the resulting performance of devices made from those semiconductors. In particular, the invention relates to the method of growing gallium nitride (GaN) ingots and epitaxial layers from the melt-solutions.

BACKGROUND OF THE INVENTION

Resent results in fabrication of GaN-based light-emitting diodes (LEDs) and laser diodes (LDs) operating in green, blue, and ultra violet spectrum region have demonstrated tremendous commercial potential of nitride semiconductors. Because of lack of GaN substrates, these devices have been developed on the sapphire or silicon carbide substrates and are suffering from high defect density in the device structures including high density of threading dislocations, up to $10^{10}$ cm$^{-2}$, domains and grain boundaries. Destructive influence of these imperfections on the device performance has been demonstrated in a number of publications. Recently, in S. Nakamura, M. Senoh, S. Nagahama, N. Iwasa, T. Yamada, T. Matsushita, H. Kiyouku, Y. Sugimoto, T. Kozaki, H. Umemoto, M. Sano, and K. Chocho, *Applied Physics Letters, Vol.* 72, p. 2014 (1998), the fabrication of LDs on free-standing reduced-defect-density 80 μm thick GaN substrate grown by hydride vapor phase epitaxy with lifetime longer than 780 hr. and threshold current density of 7 kA/cm$^2$ was reported. In contrast, the LDs fabricated under similar conditions but on a sapphire substrate exhibited shorter lifetime of 200 hr at lower operating current density.

The fact that misfit dislocations, grain boundaries, domains and residual stresses greatly reduce performance of GaN-based devices and cut their applications was experimentally proven. The main issue in GaN-based technology is lack of GaN and AlN substrates.

Foreign substrates including $Al_2O_3$, SiC, ZnO, $LiGaO_2$, $LiAlO_2$, and $ScMgAlO_4$ have been tested for GaN heteroepitaxial growth. Lattice and thermal mismatch between foreign substrate and grown GaN-based device structure originate most of the defects. It is clear that only GaN substrates will allow one to reduce defect density in GaN devices and improve device characteristics.

The main challenge in growing GaN substrates is incongruent decomposition of GaN material by sublimation that becomes noticeable at temperatures from 800–1100° C. A number of attempts to realize growth of bulk and quasi-bulk GaN crystals from vapor phase have been done. Natural ways to overcome the decomposition problem are (1) to use the chemical transport technique or (2) sublimation growth at high pressure. Both methods have been applied to grow GaN layers but due to technological difficulties no GaN ingots were grown. In these methods, thick GaN layers were grown on foreign substrates and had high defect density.

Another method to grow GaN crystals is the growth from liquid phase. The main problem in liquid phase growth of GaN from liquid phase is extremely low solubility of nitrogen in melts, particularly in Ga melt. GaN crystals having area up to 200 mm$^2$ and thickness up to 0.2 mm were grown by melt-solution technique (S. Porowski, *Proceedings of the Second International Conference on Nitride Semiconductors ICNS'97*, Tokushima, Japan, Oct. 27–31, 1997, p. 430). These GaN crystals were spontaneously nucleated and grown from nitrogen-gallium melt-solution. In order to overcome low nitrogen solubility problem, growth temperatures from 1500–1600° C. and nitrogen gas pressure from 10–20 kbar are required to grow GaN crystals. Even at these high pressures and temperatures nitrogen solubility in gallium melt is very low. As a result, at 20,000 bar and 1500° C. growth rate of about 0.01–0.05 mm/hr can be obtained. Lateral growth rate (growth rate perpendicular to [0001] crystallographic direction) was about 1 mm/day. Undoped GaN crystals grown by this method have high background electron concentration and did not exhibit edge luminescence under optical excitation. GaN ingots were not grown by this technique.

Another attempt to grow GaN crystal from Ga—N melt-solution was undertaken by Takayuki Inoue, Yoji Seki, Osamu Oda, Satoshi Kurai, Yoichi Yamada and Tsunemasa Taguchi, *Jpn. J. Appl. Phys. Vol.* 39 (2000) pp. 2394–2398. GaN crystals up to 10 mm in diameter were grown at 1475° C. under a nitrogen pressure of 0.98 GPa. High pressure in combination with high temperature required for both above methods make it difficult to perform controllable GaN crystal growth using GaN seed and develop these methods as production techniques.

One way to increase nitrogen solubility is to use not pure Ga melt but Ga with some additives. Alternative melts were used in D. Elwell, R. S. Feigelson, M. M. Simkins, and W. A. Tiller, *Journal of Crystal Growth, Vol.* 66, p. 45 (1984). Growth was carried out in the temperature range from 900 and 1000° C. A sapphire wafer used as substrate was placed in either end of the furnace and the boat was charged with 50 g of 99.9999% pure gallium, Ga/Bi and Ga/Sn alloys. Ammonia gas served as nitrogen source. Ammonia partial pressure was $(1.5–2)\times10^{-3}$ bar. As carrier gas hydrogen or argon were used. In some experiments, GaN seeds were employed. The growth reaction proceeded for 10 days. The GaN deposition was in the form of small crystallites randomly oriented with respect to the seed crystals. The largest crystal grown, of 2.5 mm in length, was part of a cluster of three crystals grown at 930° C. on SiC plate with ammonia partial pressure of $1.08\times10^{-3}$ bar. The use of seed crystals appeared to have no beneficial effect on crystal size. The addition of Bi to the solution was found to increase the number of crystallites nucleated. Tin was tried as an alternative solvent component. The major advantage of tin is that it reacts with nitrogen giving atomic nitrogen in solution. It was therefore considered possible that the solubility of atomic nitrogen in molten Ga/Sn alloy would be higher than that in Ga melt. Alloys with 10–80 at. % content of Sn were tested. Nitrogen gas was used in place of the $NH_3+H_2$ mixture with a slow growth rate of about 150 cm$^3$/day. Some GaN growth was observed, together with oxide impurities. But, in all these experiments the crystallites were smaller than pure gallium was used. GaN ingots were not grown by this technique.

Alternative way to introduce nitrogen in Ga melt to grow polycrystalline GaN was described in A. Argoitia, C. C. Hayman, J. C. Angus, L. Wang, J. S. Dyck, and K. Kash, *Applied Physics Letters, Vol.* 70, p. 179 (1997). Plasma gun was used to increase the thermodynamic activity of the nitrogen in order to raise the nitrogen concentration in the gallium. The active species in the plasma include N, N$^+$, $N_2^+$, and excited states of $N_2$. Recombination of N to form $N_2$ is strongly favored thermodynamically, however, this recombination is sufficiently slow within the gallium melt to permit the parallel formation of GaN. Synthesis of GaN was achieved by directing plasma from electron cyclotron resonance microwave source (ECR-source) onto a liquid Ga pool heated of up to 1000° C. in BN crucible. The ECR source was mounted directly above the crucible and gave an ion flux density of $10^{16}$ cm$^{-2}$sec$^{-1}$. The partial pressure of atomic nitrogen in the beam is approximately 0.05 mTorr. An argon plasma was employed for 10 min followed by a hydrogen plasma for 30 min to clean melt surface. The hydrogen flow was replaced by 10 sccm of nitrogen and the temperature raised slowly to 1000° C. During this step, the pressure was fixed at 0.5 mTorr. After 15 min., at a temperature of 700° C., the growth of a crust of polycrystalline GaN began on the melt surface. The nitrogen plasma was maintained for 12 hr at the final temperature of 1000° C. At the end of a run, a polycrystalline GaN "dome" completely covered the Ga melt. A typical "dome" was 0.1 mm thick, weighed 40 mg, and had an surface area of 70 mm$^2$. The average linear growth rate was about of 8 $\mu$m/hr. GaN crystalline ingots were not grown by this technique. Seeded growth technique was not applied. Plasma source located above the melt make difficult to introduce a seed in the melt.

Recently, in L. Allers, R. Clampitt, J. N. Hiscock, and A. T. Collins, will be published in *Proc. Intern. Conf. SiC, III-nitrides and Related Mater., Stockholm*, Aug. 31–Sep. 5, 1997, the growth of 2×2×0.1 mm$^3$ 2 H—GaN single crystals on the surface of heated Ga melt over the temperature range of 700–1100° C. using commercially available high density N-atom plasma source was reported. The method of synthesis was similar to that of described by Argoitia et al. in the previous section. The growth was undertaken in an unbaked diffusion pumped system with base pressure 10$^{-6}$ Torr. A sample of Ga/Al/In was heated to 600–1200° C. (depending on the particular metal) in a flat BN boat under N$_2$ flow for 10 min. An N atom source was mounted in close proximity to the melt and allowed to irradiate it with atomic nitrogen over a period of 3–4 hr., during which more than 100 $\mu$m nitride layer was formed on its surface. An average linear growth rate was found to be 12 $\mu$m/hr, but in some surface areas it exceeded 25 $\mu$m/hr. The convex surface of the "dome" was relatively featureless and no distinct crystalline facets could be detected. In contrast, the concave interior of the "dome" was predominantly covered with relatively large crystallites. These were mostly hexagonal randomly oriented and with diameters ranging from 10 to 100 $\mu$m. There were a number of single crystals up to 3 mm in diameter and 100 $\mu$m in thickness.

In all techniques mentioned above, there were no gallium nitride ingots grown. with or without seeds and a seed was not used to enlarge GaN crystal dimensions.

Thus, although GaN offers tremendous potential for optoelectronics and high-power high-frequency devices, such devices will realize their full potential only when crystal growth method to fabricate large size GaN crystalline ingots willbe developed.

OBJECTS AND SUMMARY OF THE INVENTION

It is an object of the present invention to provide a new advanced method forproducing a crystalline compound material, including large diameter GaN crystals.

Another object of the invention is to significantly reduce cost of the growth equipment for producing GaN crystals.

Another object of the invention is to simplify the growth process for producing GaN crystals.

Another object is to increase growth rate of GaN crystals.

Another object is to increase size of GaN crystals.

The invention meets these objects with a method of producing GaN from liquid or vapor phase at low temperature and ambient pressure comprising a step of applying electric field to produce GaN crystalline material. For the invented method, high temperature and high pressure equipment is not required.

Growth of GaN takes place at temperature less than 1100° C. and ambient pressure less than 2 atm. Using the electric field allows one to grow GaN crystals having 2 inch and larger diameter with growth rate, which can reach and exceed the value of 1 mm/hr.

GaN crystalline ingots can be grown on seeds and size of the grown GaN crystals can exceed the size of the seed in a few times.

GaN crystalline ingots can be grown on seed by drawing the growing crystal from or inside the melt.

GaN crystalline ingots can be nucleated on melt surface without seed.

These and other objects are further understood from the following detailed description of particular embodiments of the invention. It is understood, however, that the invention is capable of extended application beyond the precise details of these embodiments. Changes and modifications can be made to the embodiments neither affect the spirit of the invention neither exceed its scope, as described in the appended claims. The objects, advantages and features of the invention are illustrated by the accompanying drawings, wherein:

DETAILED DESCRIPTION OF THE PREFERRED EMBODIMENTS

Figure 1A:
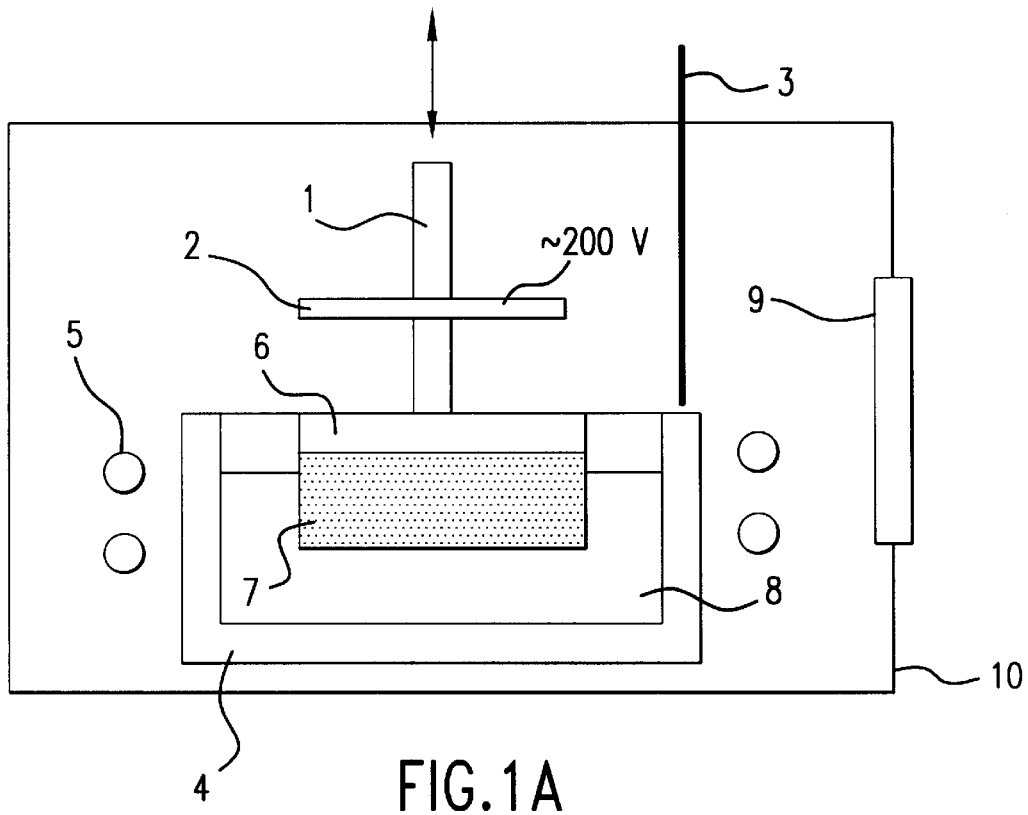
FIGS. 1a and 1b show growth cell arrangements for growth of GaN ingots by invented method: 1—seed holder, 2—electrode, 3—electrode, 4—crucible, 5 heater, 6—seed, 7—GaN ingot, 8—Ga-based melt, 9—window, and 10—reaction chamber. GaN crystal may be pulled out of the melt (a) or pushed inside the melt (b).
Figure 1B:
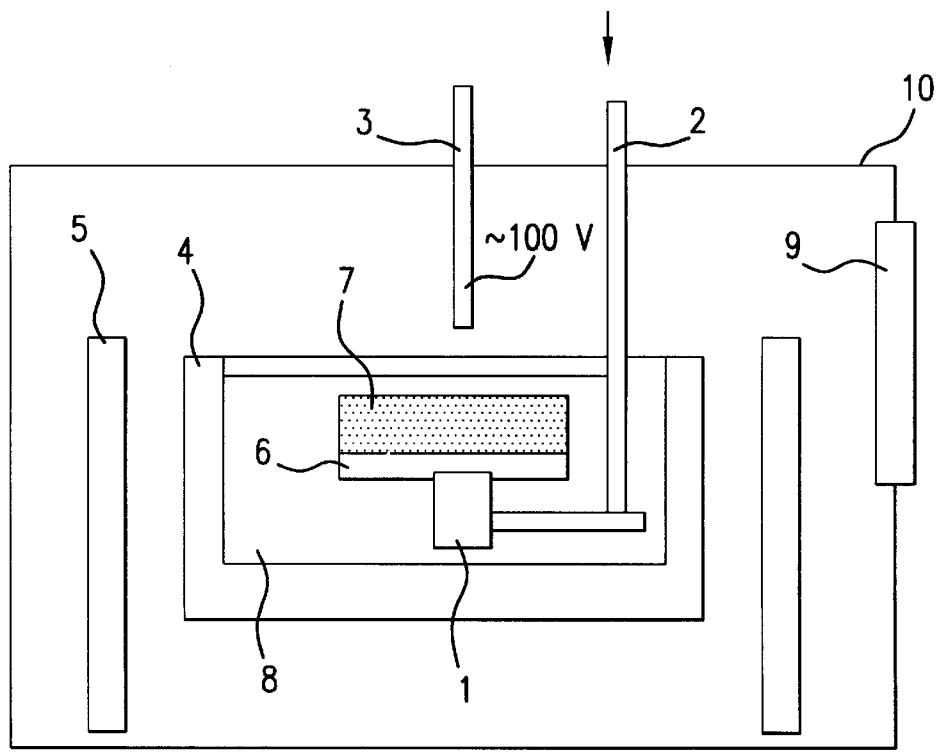
Figure 2:
FIG. 2 Photo image of the GaN about 1 mm thick wafers cut from GaN ingot grown by the invented technique.
Figure 3B:
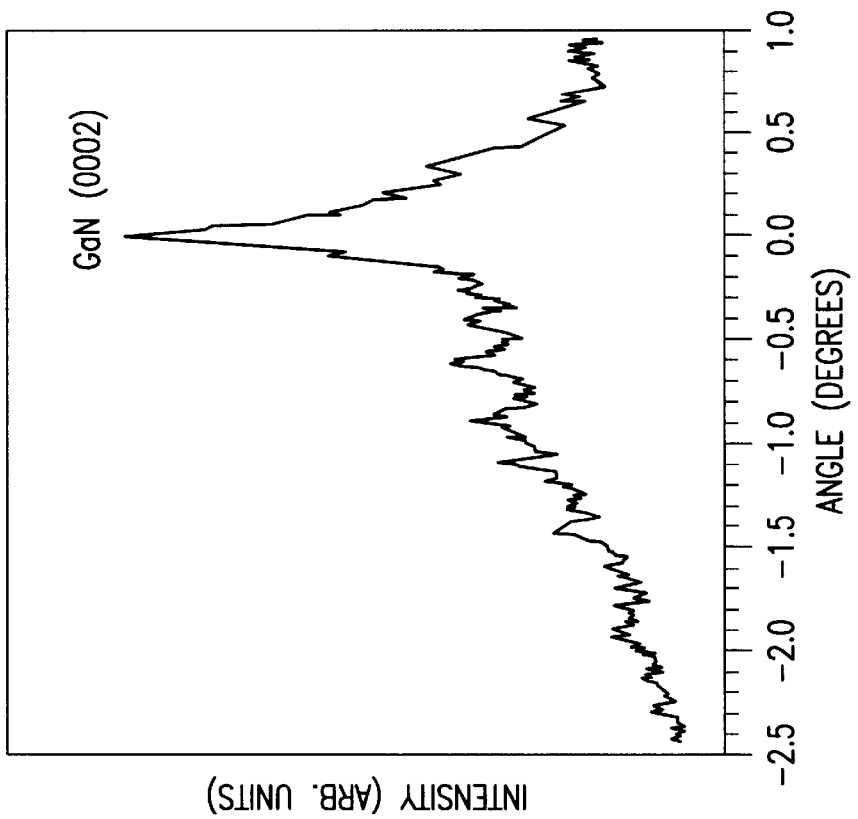
FIG. 3 is X-ray data for GaN ingots grown by the invented process: a) the fragment of X-ray diffraction pattern; b) rocking curve at ω-scan from this sample, FWHM of the peak is about 17 arc min.
Figure 3A:
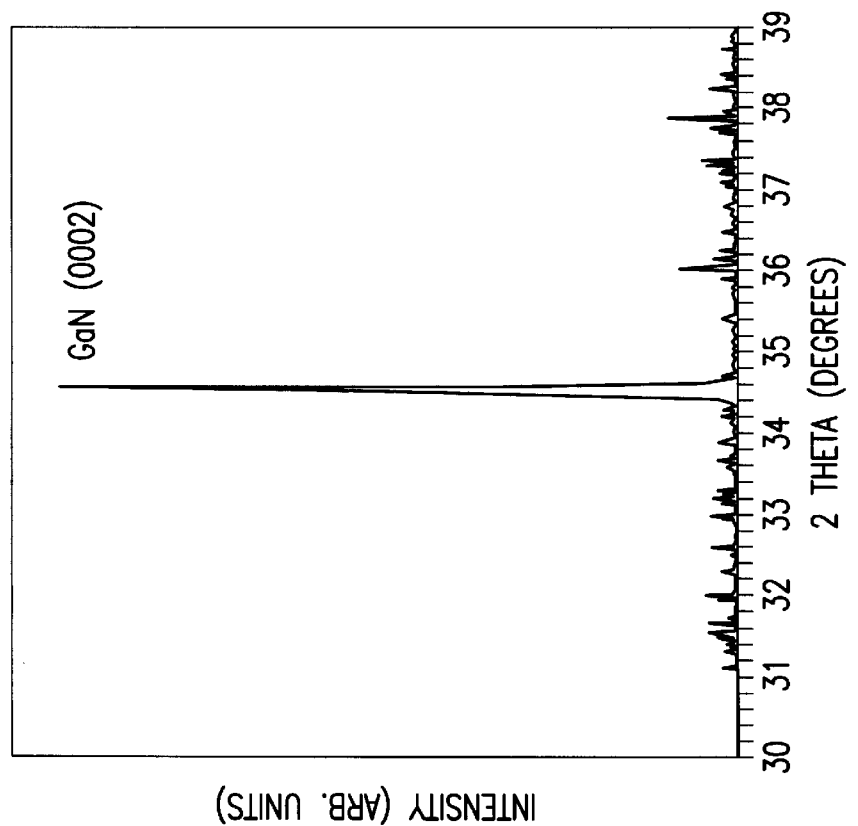
Figure 4:
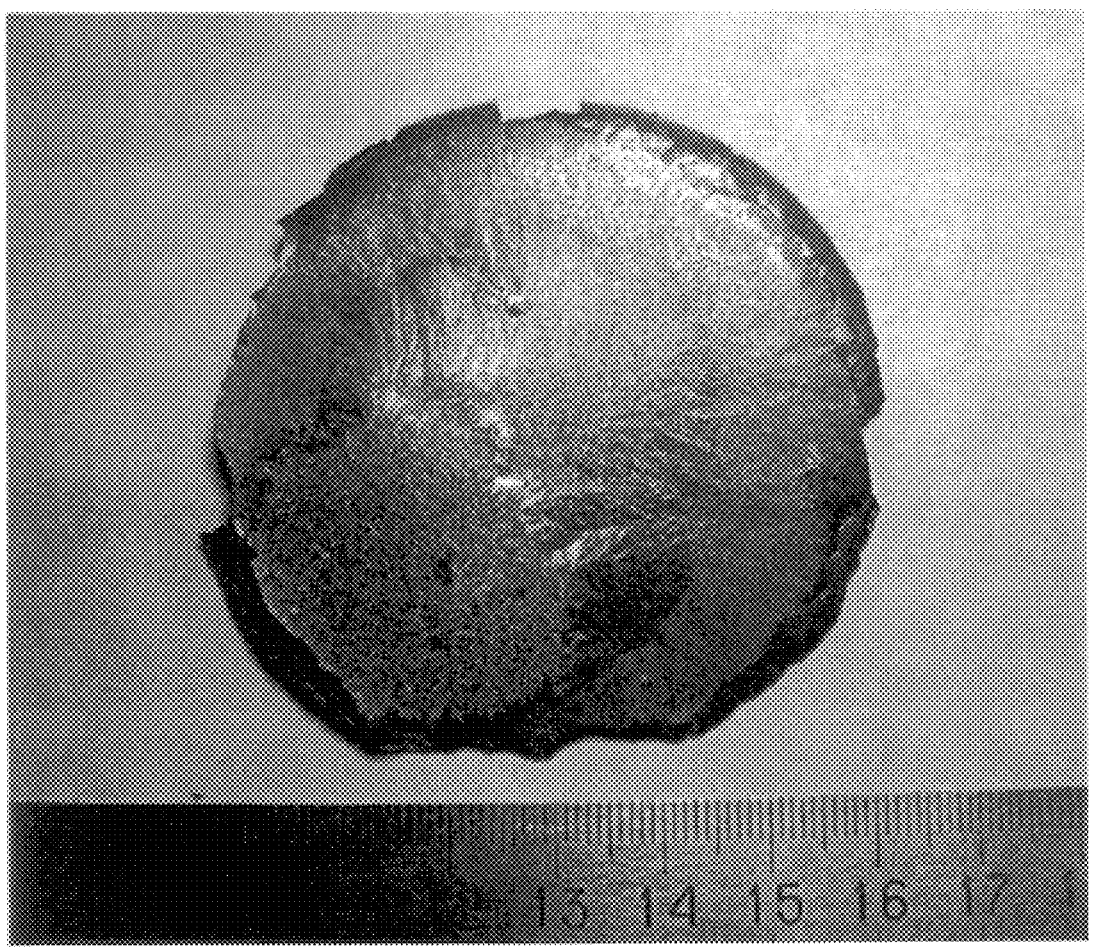
FIG. 4 is an optical photograph of 62 mm diameter GaN ingot.
Figure 5:
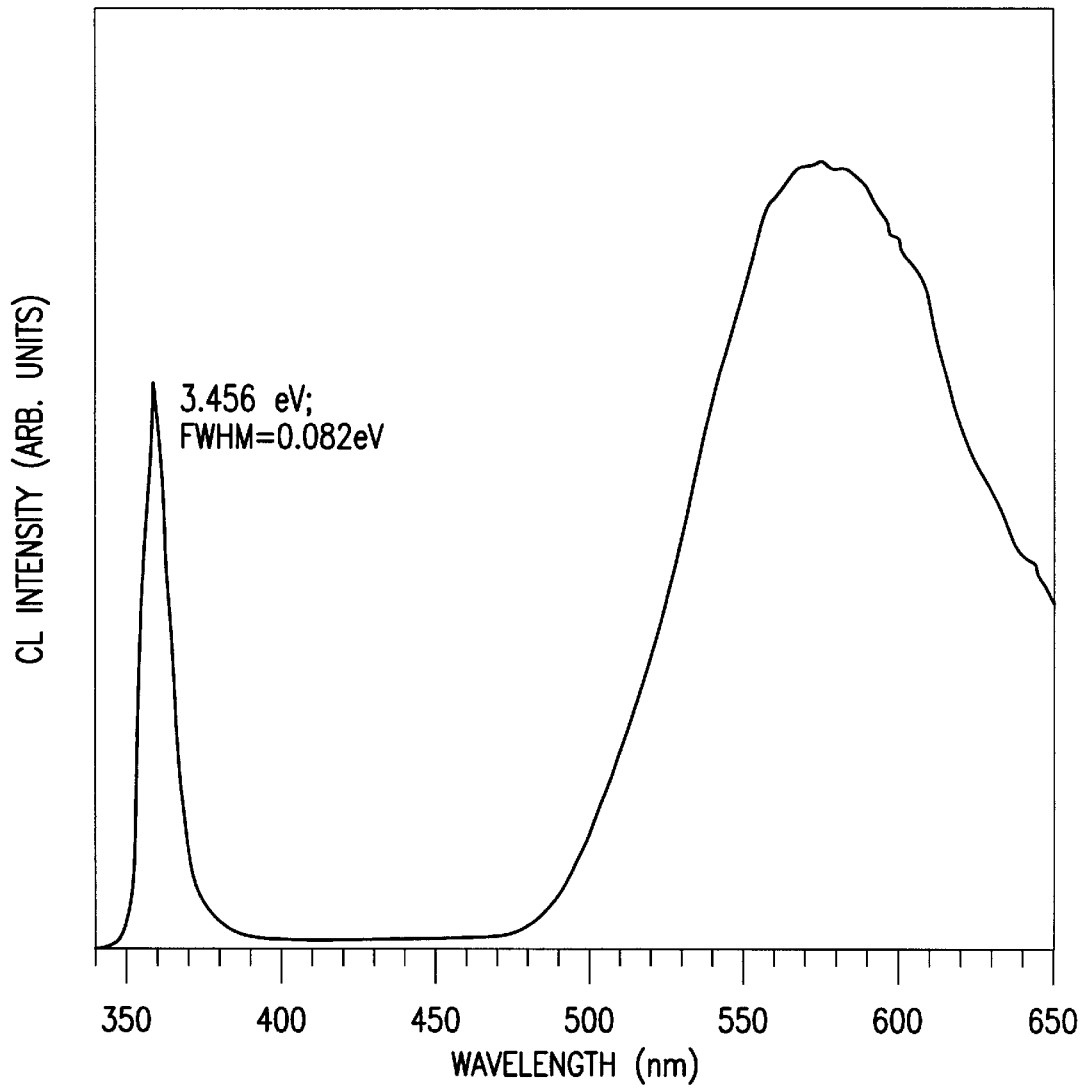
FIG. 5 is a cathodoluminescence spectrum for GaN crystal grown by invented method.
Figure 6:
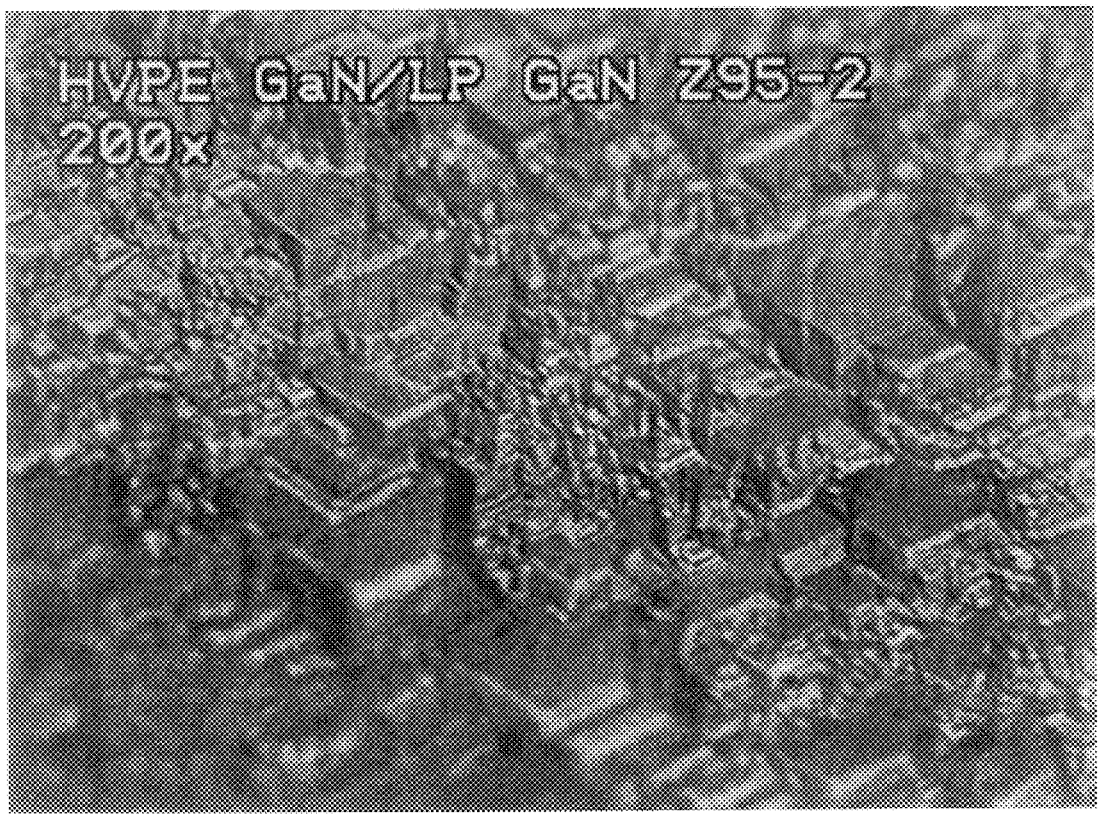
FIG. 6 is an optical micro photograph of GaN homoepitaxial layer grown on GaN crystal grown by the invented method.
Figure 7:
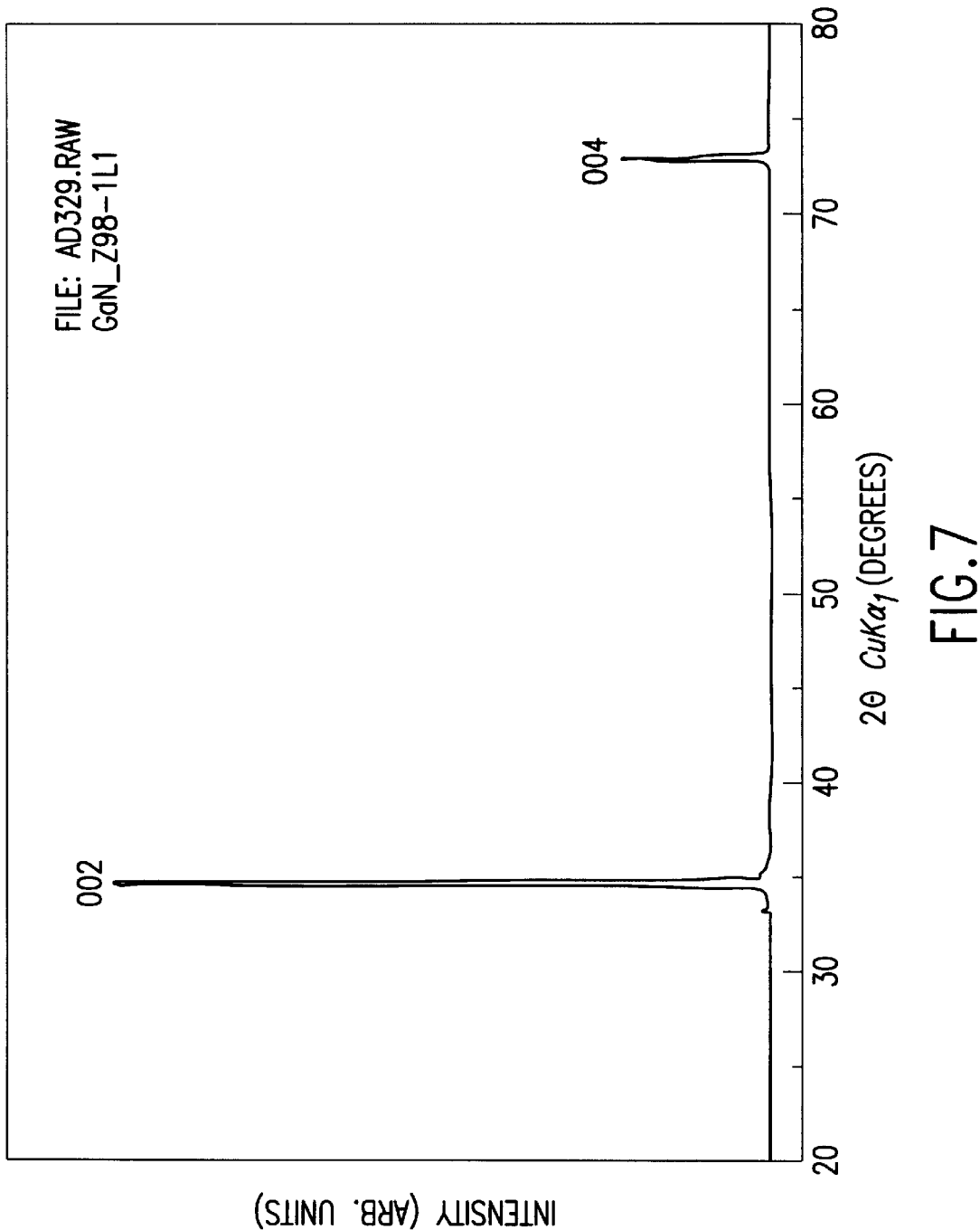
FIG. 7 is x-ray diffraction spectrum measured from 60 $\mu$m thick GaN homoepitaxial layer grown by HVPE technique on GaN ingot.

In accordance with the invention, crystalline compound material, for example GaN or AlNingot, is grown from liquid or vapor phase using electrical field. Epitaxial layers of crystalline compound material may be also grown by the invented method. The growth takes place in growth chamber or growth reactor. In the case of growth from liquid phase, the growth takes place on the melt surface, inside the melt volume or along the wetted surface of the crucible. The melt contains at least one component of the said compound material, for example Ga. Second component is supplied in gaseous form into the growth chamber, for example nitrogen gas. The melt is heated up to the growth temperature. In order to introduce second component in to the melt, for example nitrogen in to the Ga melt, electric field is applied near or at the melt surface. This electric field may be allied in ac, dc, or pulsed form. The field may be introduced by electrodes having different shape, for example pin-shape or ring-shape. When the melt is supersaturated with second component, crystallization of the compound material takes place, for example resulting in crystal growth of GaN. In order to perform the growth in controllable manner, crystalline seed may be introduced in the melt.

In this case, the growth is preferably takes place on the seed and large ingots of compound material can be growth by pulling the growing crystal from the melt or drawing the growing crystal inside the melt. If electric field is not applied, no crystal growth will accrue. Similar results were obtained for the growth of AlN ingots.

In the case of crystal growth from vapor phase, both components are introduced in the growth zone in a gaseous form, for example Ga vapor and nitrogen gas to grow GaN ingots. Crystal growth takes place on a seed introduced in the growth zone. The preferable seed for GaN growth is GaN single crystal wafer. The seed is heated to growth temperature. In order to grow compound material, electric field is applied to or near the seed. This electric field promotes a reaction between gaseous substances resulting in the formation of compound material, for example GaN. When growth is completed, the electric field is switched off and grown ingot is removed from the growth chamber.

Grown GaN ingots were sliced and polished to produce GaN substrates for bulk and epitaxial growth of GaN and other group III nitride semiconductor materials and devices.

The examples of growth process of bulk GaN and AlN crystals according to the present invention are described below. These examples are not intended to limit the invention.

EMBODIMENT 1

GaN ingots were grown from the Ga melt. Growth processes were conducted in a water-cooled stainless steel chamber supplied by 5 MHz RF generator which provided heating for a graphite susceptor. The melt was placed in a graphite crucible. The growth procedure began from the evacuation of the chamber down to $10^{-5}$ Torr and keeping the Ga-based melt at 500° C. to removing of the gallium oxide from the melt surface, then the growth chamber was filled with nitrogen-argon gas mixture. Meanwhile, the melt temperature was rapidly rising to 900° C. This temperature remained constant or slightly decreased during the growth run. Temperature distribution in the melt could be varied by displacement of thermal shields surrounding crucible. In any case, temperature of the melt surface was the lowest one. GaN seed was introduced in to the melt. DC 300 V electric supply was used to apply voltage between Ga melt and an electric electrode introduced arranged in the chamber. Current density was about $10^{-4}$ A/cm$^2$. GaN growth took place on GaN seed. The seed was 15 mm in diameter. The seed was rotated during the growth. As a result of this growth process, single crystal GaN ingot 20 mm long and 25 mm in diameter was grown in 10 hours.

EMBODIMENT 2

In another experiment, In—Ga alloy was used as a melt for GaN growth. Ga concentration in the melt was 20 at. %. Reactor chamber, where the process took place, was filled with nitrogen gas. Gas pressure was 0.5 atm. Pulsed electric field was applied to grow GaN ingots. The maximum strength of the field was of about 200 V/cm at the melt surface. SiC substrate 35 mm in diameter was used as a seed. GaN was deposited on (0001)Si face of 6H—SiC seed. SiC seed was introduced into the melt. Melt temperature was 1000° C. at the beginning of the growth. During the growth, the melt was cooled down to 900° C. As a result of the growth, GaN ingot 40 mm in diameter and 10 mm long was grown.

EMBODIMENT 3

The growth of RP bulk GaN was performed in gallium-bismuth meltsolution placed in a rf-heated graphite crucible. Ga concentration in the melt was 80 at. %. A pressure of nitrogen-hydrogen ambient atmosphere was kept at 0.1 atm. The temperature of the melt was 800° C. GaN crystal was nucleated on GaN single crystal seed. This seed was fabricated in a separate growth run by hydride vapor phase epitaxy. Electric AC field was applied in between two electrodes situated close to the melt surface. Ga covered the surface of GaN ingot, which was pushed inside the melt during the growth. The pushing rate varied from 0.01 to 3 mm/hr. In this case, GaN was grown close to the melt-solution surface. Crucible was rotated. Temperature gradient exists in the melt-solution. Temperature of the melt surface is higher than the temperature in the melt volume. At the end of the growth run, the rf power and electric field was switched off and the melt was rapidly cooled down. Grown crystals were removed from the frozen melt and cleaned by etching in 1:3 HF:HNO$_3$ mixture. GaN ingot 20 mm in diameter and 20 mm long was grown.

In order to grow doped GaN, Mg and Zn impurities were added in to the melt. GaN ingots containing up to $10^{20}$ cm$^{-3}$ Mg and Zn were grown. Impurity concentration was measure by Auger electron spectroscopy (AES) and secondary ion mass spectrometry (SIMS).

After the growth, GaN ingots were sliced in GaN wafers. Homoepitaxial GaN layers were grown on these wafers.

EMBODIMENT 4

The GaN bulk crystal having 50 mm in diameter was grown from the liquid phase at reduced ambient pressure in accordance with the following steps:
(1) The 40 g of as pure as 99.99999% Ga was loaded in a graphite crucible.
(2) The crucible was placed in 90 mm diameter and 110 mm height resistive heater connected to 5 kW power supply.
(3) The stainless steel reactor was totally exhausted by a vacuum pump, hydrogen was introduced into the reactor, thus replacing the air in the reactor with hydrogen gas.
(4) Thereafter, the crucible was heated up to 700° C. by the heater, and this state was held for 30 min to remove the oxide film from the surface of the melt.
(5) The temperature of the heater was decreased down to room temperature and reactor was secondly pumped out down to $10^{-3}$ Torr.
(6) Subsequently, pure nitrogen gas was supplied from the injection pipe to fill the reactor up to 20 Torr gas pressure.
(7) Thereafter, temperature of the resistive heater was increased to 980° C. This state was maintained until temperature of the melt reached the value of 950° C.
(8) After the temperature of the melt was stabilized at 950° C., pure nitrogen gas was flowed above the melt surface at a flow rate of 0.5 l/min.
(9) In order to initiate the growth of GaN crystal, electrical pin-shaped electrode was placed 1 cm above the melt surface. This electrode was connected to the positive pole of the electrical source (electric supply). Negative pole of the source was connected via crucible to the melt. The electric supply was turned on and constant electrical field between the melt and electrical contact was created, thereby growing a GaN bulk crystal on the surface of the melt. At 190 V/cm electrical field normal growth rate was equal to 0.025 mm/hr.

After 20 hr growth run the source of electrical field was turned off and temperature of the heater was decreased down to room temperature in 5 hr cooling period. Grown crystal having thickness of 0.5 mm and diameter of 50 mm was detached from the residual melt, etched in aqua regia and cleansed in deionized water. The crystal was examined by x-ray diffraction (XRD) technique in 2θ scanning geometry.

EMBODIMENT 5

A gallium nitride bulk crystal was grown following the same procedures as in EXAMPLE 4 except that the electric field for the electrical contact and melt was supplied from alternative current (ac) source. Ring-shaped electrode was used. The upper voltage of the source was 500 V. During the growth electrical current produced by applied electic field was varied from 0.0001 to 1 A by varying the applied voltage. At the beginning of the growth small current was used to nucleate high-quality GaN crystal on melt surface. After the nucleation, the current was increase to increase GaN growth rate. GaN crystalline ingot 60 mm in diameter and 10 mm in length was grown in 10 hours. Capacitance-voltage characterization performed on GaN wafers sliced from the above GaN ingot indicated that the grown material has n-type conductivity was concentration $Nd—Na < 10^{18}$ $cm^{-3}$.

EMBODIMENT 6

A gallium nitride bulk crystal grown from the melt-solution according to the same procedure as in EXAMLE 4 except that GaN ingot was grown on GaN seed introduced in the melt. Growth temperature was 800° C. Bulk GaN crystal of 50 mm in diameter and 10 mm in thickness was successfully grown.

EMBODIMENT 7

Gallium nitride epitaxial layer was grown from the melt-solution according to the same procedure as in EXAMPLE 4 except that the temperature of the melt was 1000° C., and the gas pressure in the reactor was 5 Torr. The growth was carried out on SiC substrate. Single crystal GaN layer 0.020 mm in thickness and 10 mm in diameter was grown in 10 hr runs. So, normal growth rate of 0.002 mm/hr and lateral growth rate of 1 mm/hr were measured. Photoluminescence (PL) measurements made on the grown crystals showed superior optical properties of GaN grown at higher temperatures compared to those of produced at lower temperatures.

EMBODIMENT 8

GaN ingot was grown from the melt-solution according to the same procedure as in EXAMPLE 1 and 5. Resulted GaN ingots were sliced in GaN wafers. GaN epitaxial layers were grown on the said GaN wafers by hydride vapor phase epitaxy (HVPE) at 1020° C. Thickness of GaN epitaxial layers ranged from 50 to 300 μm depending on duration of the HVPE growth. Growth rate for the deposition of GaN epitaxial layers was less than 10 mm/hr. X-ray diffraction measurements proved single crystal structure of the grown GaN epitaxial layer. The full width at a half maximum (FWHM) of x-ray rocking curve measured for GaN layer grown by HVPE was less than 600 arc sec. For some samples, initial GaN wafer was removed by mechanical polishing resulting in free-standing GaN material grown by HVPE. These single crystal GaN materials up to 60 mm in diameter were suitable to be used as substrates for the fabrication of GaN devices, particular for GaN-based light emitters.

EMBODIMENT 9

A gallium nitride ingot was grown from vapor phase on GaN seed. Ga melt placed in graphite crucible was heated up to 1200° C. to provide Ga vapor in to growth zone. Nitrogen gas introduced in growth zone served as nitrogen source. The seed was heated by a separate heater up to 1100° C. Electric field was applied between two ring-shaped electrodes placed around the seed, GaN ingot 6 mm thick 52 mm in diameter was grown on the seed in 20 hr.

EMBODIMENT 10

A gallium nitride ingot grown from the melt-solution according to the same procedure as in EXAMPLE 6 except that crucible diameter was 120 mm and heater diameter was 140 mm. Growth temperature was 800° C. Bulk GaN crystal of 102 mm in diameter and 15 mm in thickness was successfully grown in 48 hr. Crystalline structure of grown material was proved by x-ray diffraction.

In this disclosure, there are shown and described only the preferred embodiment of the invention, but it is to be understood that the invention is capable of changes and modifications within the scope of the inventive concept as expressed herein.

What is claimed is:

1. A method of growing a crystalline Group III nitride compound material, comprising the steps of:

placing a first substance into a chamber, supplying a second gaseous substance containing nitrogen into the chamber, and applying electrical field inside the chamber to produce the crystalline Group III nitride compound material grown from a liquid phase.

2. The method of claim 1 further comprising the step of placing a seed crystal into the chamber to control growth of the crystalline Group III nitride compound material.

3. The method of claim 1, wherein the first substance is a non-gaseous material.

4. The method of claim 3 further comprising the step of heating the first substance carried out before the step of applying electrical field, to produce a liquid material.

5. The method of claim 3, wherein the first substance contains a group III metal.

6. The method of claim 5, wherein the first substance contains gallium.

7. The method of claim 1, wherein the electric field is provided by an electrode completely surrounded by the second gaseous substance.

8. The method of claim 2, wherein during the growth of the crystalline Group III nitride compound material, the seed crystal is moved inside an area of the chamber occupied by the first substrate.

9. The method of claim 1, wherein the growing crystalline Group III nitride compound material is doped with impurities during the growth run to control the electrical conductivity of the growing compound material.

10. The method of growing of single crystal compound material comprising deposition of single crystal compound material deposited on wafers sliced from the ingot of crystalline material grown by the method of claim 1.

11. A method of growing a crystalline Group III nitride compound material, comprising the steps of:

placing a first substance into a chamber, supplying a second gaseous substance containing nitrogen into the chamber, and applying electrical field inside the chamber to produce the crystalline Group III nitride compound material grown from a vapor phase.

12. The method of claim 11, wherein the first substance contain a vaporous material.

13. The method of claim 12, wherein the vaporous material contains a group III metal.

14. The method of claim 13, wherein the vaporous material contains gallium.

\* \* \* \* \*